(12) United States Patent
Low et al.

(10) Patent No.: US 9,094,057 B2
(45) Date of Patent: Jul. 28, 2015

(54) PARASITIC CIRCUIT FOR DEVICE PROTECTION

(75) Inventors: Zhen Ning Low, La Jolla, CA (US); Charles E. Wheatley, III, San Diego, CA (US); Sergio P. Estrada, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 828 days.

(21) Appl. No.: 13/039,142

(22) Filed: Mar. 2, 2011

(65) Prior Publication Data

US 2012/0050015 A1 Mar. 1, 2012

Related U.S. Application Data

(60) Provisional application No. 61/376,991, filed on Aug. 25, 2010.

(51) Int. Cl.
| | |
|---|---|
| *G06K 7/01* | (2006.01) |
| *H05K 9/00* | (2006.01) |
| *H01Q 11/12* | (2006.01) |
| *H04Q 5/22* | (2006.01) |
| *H04B 5/00* | (2006.01) |
| *G06K 7/10* | (2006.01) |

(Continued)

(52) U.S. Cl.
CPC ............ *H04B 5/005* (2013.01); *G06K 7/10158* (2013.01); *G06K 19/0715* (2013.01); *H02J 5/005* (2013.01); *H02J 7/025* (2013.01); *H04B 5/0087* (2013.01); *H05K 9/0071* (2013.01); *H04B 5/0031* (2013.01); *H04B 5/0037* (2013.01)

(58) Field of Classification Search
CPC ........................................................ G06K 7/01
USPC ................ 340/10.1, 572.3, 572.5, 10.2, 10.5; 235/492; 307/91; 455/1, 12.1, 41.2
See application file for complete search history.

(56) References Cited

U.S. PATENT DOCUMENTS 4,328,497 A * 5/1982 Vale ................................ 342/18
5,061,941 A * 10/1991 Lizzi et al. ..................... 343/742

(Continued)

FOREIGN PATENT DOCUMENTS

| CN | 1227627 C | 11/2005 |
|---|---|---|
| CN | 101303744 A | 11/2008 |

(Continued)

OTHER PUBLICATIONS

Partial International Search Report—PCT/US2011/048849—ISA/EPO—Nov. 2, 2011.

(Continued)

*Primary Examiner* — Nam V Nguyen
(74) *Attorney, Agent, or Firm* — Knobbe Martens Olson & Bear LLP

(57) ABSTRACT

Exemplary embodiments are directed to a device include a parasitic coil for protection of the device. A device may include a first circuit configured to receive a first transmitted signal at an operational frequency. The device may also include a second circuit a second circuit configured to generate a field that opposes at least one of an undesirable portion of a wireless power field of the first transmitted signal and a portion of another wireless power field proximate the first circuit, the another wireless power field generated by a second transmitted signal at a non-operational frequency of the first circuit.

25 Claims, 7 Drawing Sheets

(51) Int. Cl.
  *G06K 19/07* (2006.01)
  *H02J 5/00* (2006.01)
  *H02J 7/02* (2006.01)

(56) References Cited

U.S. PATENT DOCUMENTS

| | | | |
|---|---|---|---|
| 5,278,505 A | 1/1994 | Arakawa | |
| 5,602,556 A * | 2/1997 | Bowers | 343/742 |
| 5,644,225 A * | 7/1997 | Alfors et al. | 324/202 |
| 5,821,525 A * | 10/1998 | Takebayashi | 235/492 |
| 5,966,641 A * | 10/1999 | Flowerdew | 455/41.1 |
| 6,072,383 A | 6/2000 | Gallagher, III | |
| 6,208,235 B1 * | 3/2001 | Trontelj | 340/10.1 |
| 6,960,984 B1 * | 11/2005 | Vicci et al. | 340/10.1 |
| 7,053,841 B2 * | 5/2006 | Ponce De Leon et al. | 343/702 |
| 7,221,900 B2 * | 5/2007 | Reade et al. | 455/1 |
| 7,283,044 B2 * | 10/2007 | Bandy | 340/505 |
| 7,573,424 B2 * | 8/2009 | Mei | 343/700 MS |
| 7,616,158 B2 * | 11/2009 | Mak et al. | 343/700 MS |
| 7,706,755 B2 * | 4/2010 | Muhammad et al. | 455/76 |
| 7,768,400 B2 | 8/2010 | Lawrence et al. | |
| 8,121,532 B2 * | 2/2012 | Huang | 455/1 |
| 8,200,302 B2 * | 6/2012 | Yamamoto et al. | 455/575.7 |
| 8,526,903 B2 * | 9/2013 | Gudem et al. | 455/310 |
| 8,543,163 B2 * | 9/2013 | Jin | 455/558 |
| 2005/0088345 A1 * | 4/2005 | De La Torre Barreiro | 343/702 |
| 2007/0075145 A1 * | 4/2007 | Arendonk | 235/492 |
| 2007/0205748 A1 | 9/2007 | Abou | |
| 2009/0036082 A1 * | 2/2009 | Sajid et al. | 455/296 |
| 2009/0041241 A1 * | 2/2009 | Dobyns et al. | 380/252 |
| 2009/0081943 A1 * | 3/2009 | Dobyns et al. | 455/1 |
| 2010/0156741 A1 * | 6/2010 | Vazquez et al. | 343/846 |

FOREIGN PATENT DOCUMENTS

| | | |
|---|---|---|
| DE | 3936547 A1 | 5/1991 |
| DE | 102010017202 A1 | 1/2011 |
| GB | 2001250 A | 1/1979 |
| JP | 2000286630 A | 10/2000 |
| JP | 2002515155 A | 5/2002 |
| JP | 2007512611 A | 5/2007 |
| JP | 2007234896 A | 9/2007 |
| JP | 2010283819 A | 12/2010 |
| WO | WO9749076 A1 | 12/1997 |
| WO | WO9843218 A1 | 10/1998 |

OTHER PUBLICATIONS

International Search Report and Written Opinion dated Jan. 23, 2012 for PCT/US2011/048849, filed Aug. 23, 2011—ISA/EPO.

* cited by examiner

PARASITIC CIRCUIT FOR DEVICE PROTECTION

CLAIM OF PRIORITY UNDER 35 U.S.C. §119

This application claims priority under 35 U.S.C. §119(e) to:

U.S. Provisional Patent Application 61/376,991 entitled "PROTECTING NFC/RFIDS CARD" filed on Aug. 25, 2010, the disclosure of which is hereby incorporated by reference in its entirety.

BACKGROUND

1. Field

The present invention relates generally to card (e.g. NFC or RFID) protection. More specifically, present invention relates to methods and devices for protecting cards, such as NFC or RFID cards, from harmful magnetic fields.

2. Background

Approaches are being developed that use over the air power transmission between a transmitter and the device to be charged. These generally fall into two categories. One is based on the coupling of plane wave radiation (also called far-field radiation) between a transmit antenna and receive antenna on the device to be charged which collects the radiated power and rectifies it for charging the battery. Antennas are generally of resonant length in order to improve the coupling efficiency. This approach suffers from the fact that the power coupling falls off quickly with distance between the antennas. So charging over reasonable distances (e.g., >1-2 m) becomes difficult. Additionally, since the system radiates plane waves, unintentional radiation can interfere with other systems if not properly controlled through filtering.

Other approaches are based on inductive coupling between a transmit antenna embedded, for example, in a "charging" mat or surface and a receive antenna plus rectifying circuit embedded in the host device to be charged. This approach has the disadvantage that the spacing between transmit and receive antennas must be very close (e.g. mms). Though this approach does have the capability to simultaneously charge multiple devices in the same area, this area is typically small, hence the user must locate the devices to a specific area.

A device, such as a Near Field Communication (NFC) or RFID card, may receive excessive power from a wireless power transmitter when located within a charging area of the wireless power transmitter, even if the card operates on a different frequency than that used by a wireless power transmitter. Receiving excessive power may result in loss of power to the intended devices and possibly damage the card due to overheating. A need exist for methods, systems, and devices for protecting a device from excessive power generated by a wireless power transmitter.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

The term "wireless power" is used herein to mean any form of energy associated with electric fields, magnetic fields, electromagnetic fields, or otherwise that is transmitted between a transmitter to a receiver to power the receiver without the use of physical electromagnetic conductors. Hereafter, all three of this will be referred to generically as radiated fields, with the understanding that pure magnetic or pure electric fields do not radiate power. These must be coupled to a "receiving antenna" to achieve power transfer.

Figure 1:
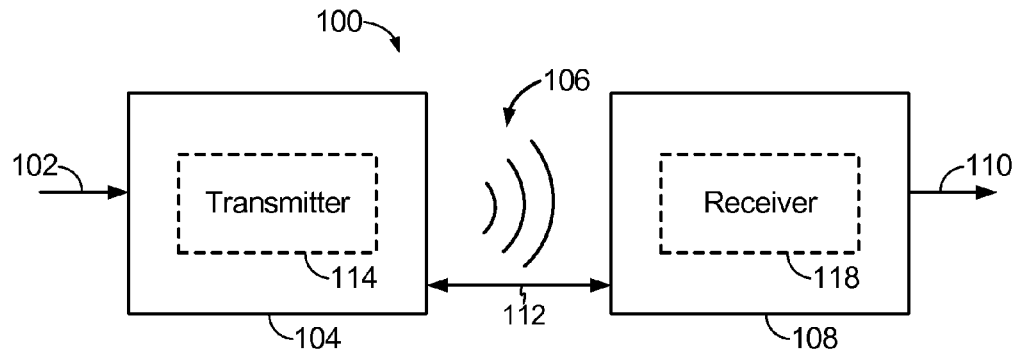
FIG. 1 shows a simplified block diagram of a wireless power transfer system.

FIG. 1 illustrates a wireless transmission system 100, in accordance with various exemplary embodiments of the present invention. System 100 may be configured for wireless power transfer, near-field communication, or both. Input power 102 is provided to a transmitter 104 for generating a field 106 for providing energy transfer. A receiver 108 couples to the field 106 and generates an output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship and when the resonant frequency of receiver 108 and the resonant frequency of transmitter 104 are very close, transmission losses between the transmitter 104 and the receiver 108 are minimal when the receiver 108 is located in the "near-field" of the field 106.

Transmitter 104 further includes a transmit antenna 114 for providing a means for near-field communication, energy transmission, or both, and receiver 108, which includes a receive antenna 118 for providing a means for energy reception, near-field communication, or both. The transmit and receive antennas are sized according to applications and devices to be associated therewith. As stated, an efficient energy transfer occurs by coupling a large portion of the energy in the near-field of the transmitting antenna to a receiving antenna rather than propagating most of the energy in an electromagnetic wave to the far field. When in this near-field a coupling mode may be developed between the transmit antenna 114 and the receive antenna 118. The area around the antennas 114 and 118 where this near-field coupling may occur is referred to herein as a coupling-mode region. As will be described more fully below, receiver 108 may also include a device (e.g., a circuit), which is configured to protect at least a portion of a device that includes receiver (e.g., protect a region of the device, protect circuitry integrated within the device, or both) from excessive power wirelessly transmitted from transmitter 104.

Figure 2:
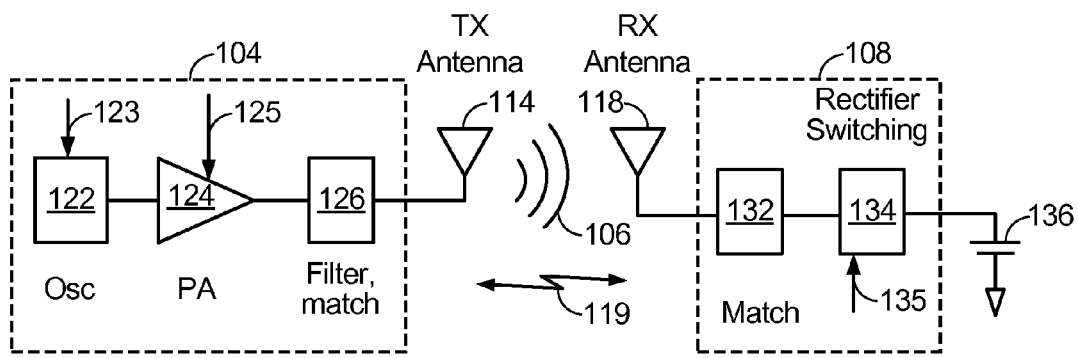
FIG. 2 shows a simplified schematic diagram of a wireless power transfer system.

FIG. 2 shows a simplified schematic diagram of a system, which may comprise a wireless power system, a near-field communication system, or both. The transmitter 104 includes an oscillator 122, a power amplifier 124 and a filter and matching circuit 126. The oscillator is configured to generate at a desired frequency, such as 468.75 KHz, 6.78 MHz or 13.56 MHz, which may be adjusted in response to adjustment signal 123. The oscillator signal may be amplified by the power amplifier 124 with an amplification amount responsive to control signal 125. The filter and matching circuit 126 may be included to filter out harmonics or other unwanted frequencies and match the impedance of the transmitter 104 to the transmit antenna 114.

The receiver 108 may include a matching circuit 132 and a rectifier and switching circuit 134 to generate a DC power output to charge a battery 136 as shown in FIG. 2 or power a device coupled to the receiver (not shown). The matching circuit 132 may be included to match the impedance of the receiver 108 to the receive antenna 118. The receiver 108 and transmitter 104 may communicate on a separate communication channel 119 (e.g., Bluetooth, zigbee, cellular, etc). As will be described more fully below, receiver 108 may also include a circuit configured for generating a field, which opposes a field generated by transmitter 404 and, thus, at least partially protecting at least a portion of a device that includes receiver 108 from excessive wireless power.

Figure 3:
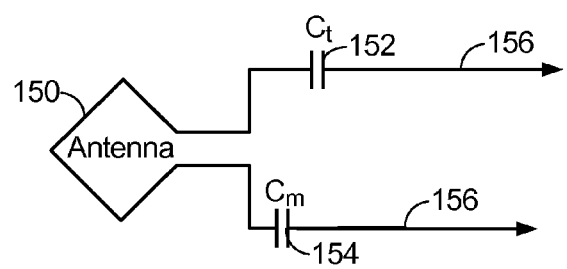
FIG. 3 illustrates a schematic diagram of a loop antenna for use in exemplary embodiments of the present invention.

As illustrated in FIG. 3, antennas used in exemplary embodiments may be configured as a "loop" antenna 150, which may also be referred to herein as a "magnetic" antenna. Loop antennas may be configured to include an air core or a physical core such as a ferrite core. Air core loop antennas may be more tolerable to extraneous physical devices placed in the vicinity of the core. Furthermore, an air core loop antenna allows the placement of other components within the core area. In addition, an air core loop may more readily enable placement of the receive antenna 118 (FIG. 2) within a plane of the transmit antenna 114 (FIG. 2) where the coupled-mode region of the transmit antenna 114 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the near-field of the transmitting antenna to the receiving antenna residing in the neighborhood where this near-field is established rather than propagating the energy from the transmitting antenna into free space.

The resonant frequency of the loop or magnetic antennas is based on the inductance and capacitance. Inductance in a loop antenna is generally simply the inductance created by the loop, whereas, capacitance is generally added to the loop antenna's inductance to create a resonant structure at a desired resonant frequency. As a non-limiting example, capacitor 152 and capacitor 154 may be added to the antenna to create a resonant circuit that generates resonant signal 156. Accordingly, for larger diameter loop antennas, the size of capacitance needed to induce resonance decreases as the diameter or inductance of the loop increases. Furthermore, as the diameter of the loop or magnetic antenna increases, the efficient energy transfer area of the near-field increases. Of course, other resonant circuits are possible. As another non-limiting example, a capacitor may be placed in parallel between the two terminals of the loop antenna. In addition, those of ordinary skill in the art will recognize that for transmit antennas the resonant signal 156 may be an input to the loop antenna 150.

Figure 4:
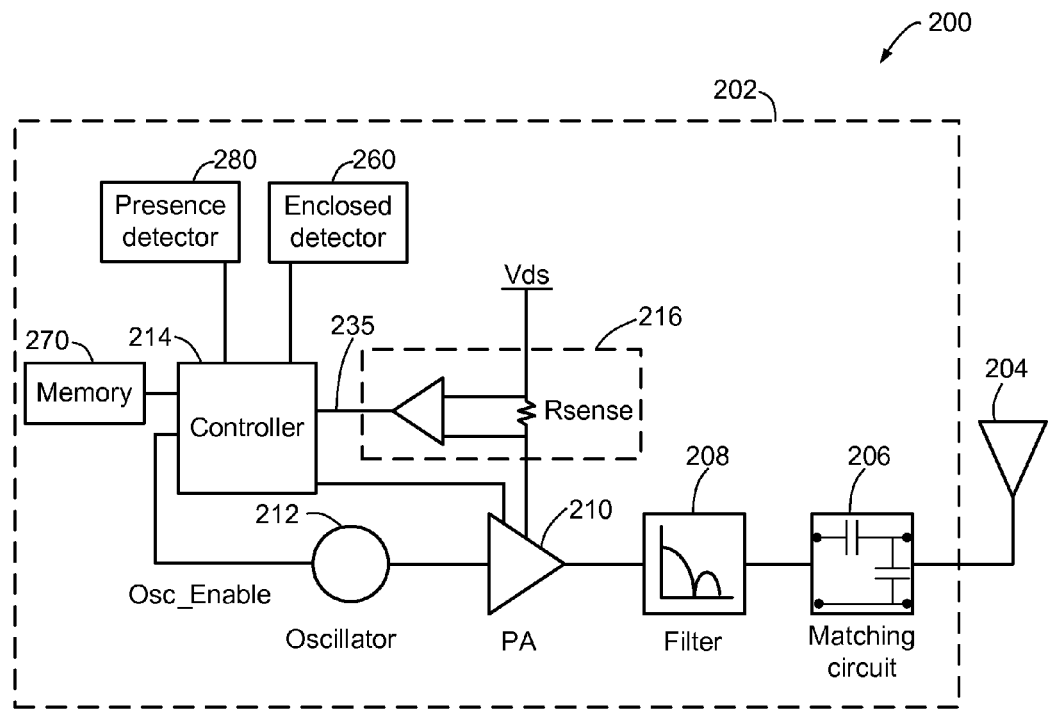
FIG. 4 is a simplified block diagram of a transmitter, in accordance with an exemplary embodiment of the present invention.

FIG. 4 is a simplified block diagram of a transmitter 200, in accordance with an exemplary embodiment of the present invention. The transmitter 200 includes transmit circuitry 202 and a transmit antenna 204. Generally, transmit circuitry 202 may provide RF power to the transmit antenna 204 by providing an oscillating signal resulting in generation of near-field energy about the transmit antenna 204. It is noted that transmitter 200 may operate at any suitable frequency. By way of example, transmitter 200 may operate at a desired frequency, such as 468.75 KHz, 6.78 MHz or 13.56 MHz.

Exemplary transmit circuitry 202 includes a fixed impedance matching circuit 206 for matching the impedance of the transmit circuitry 202 (e.g., 50 ohms) to the transmit antenna 204 and a low pass filter (LPF) 208 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that can be varied based on measurable transmit metrics, such as output power to the antenna or DC current drawn by the power amplifier. Transmit circuitry 202 further includes a power amplifier 210 configured to drive an RF signal as determined by an oscillator 212. The transmit circuitry may be comprised of discrete devices or circuits, or alternately, may be comprised of an integrated assembly. An exemplary RF power output from transmit antenna 204 may be on the order of 2.5 Watts.

Transmit circuitry 202 further includes a controller 214 for enabling the oscillator 212 during transmit phases (or duty cycles) for specific receivers, for adjusting the frequency or phase of the oscillator, and for adjusting the output power level for implementing a communication protocol for interacting with neighboring devices through their attached receivers. It is noted that the controller 214 may also be referred to herein as processor 214. As is well known in the art, adjustment of oscillator phase and related circuitry in the transmission path allows for reduction of out of band emissions, especially when transitioning from one frequency to another.

The transmit circuitry 202 may further include a load sensing circuit 216 for detecting the presence or absence of active receivers in the vicinity of the near-field generated by transmit antenna 204. By way of example, a load sensing circuit 216 monitors the current flowing to the power amplifier 210, which is affected by the presence or absence of active receivers in the vicinity of the near-field generated by transmit antenna 204. Detection of changes to the loading on the power amplifier 210 are monitored by controller 214 for use in determining whether to enable the oscillator 212 for transmitting energy and to communicate with an active receiver.

Transmit antenna 204 may be implemented with a Litz wire or as an antenna strip with the thickness, width and metal type selected to keep resistive losses low. In a conventional implementation, the transmit antenna 204 can generally be configured for association with a larger structure such as a table, mat, lamp or other less portable configuration. Accordingly, the transmit antenna 204 generally will not need "turns" in order to be of a practical dimension. An exemplary implementation of a transmit antenna 204 may be "electrically small" (i.e., fraction of the wavelength) and tuned to resonate at lower usable frequencies by using capacitors to define the resonant frequency.

The transmitter 200 may gather and track information about the whereabouts and status of receiver devices that may be associated with the transmitter 200. Thus, the transmitter circuitry 202 may include a presence detector 280, an enclosed detector 290, or a combination thereof, connected to the controller 214 (also referred to as a processor herein). The controller 214 may adjust an amount of power delivered by the amplifier 210 in response to presence signals from the presence detector 280 and the enclosed detector 290. The transmitter may receive power through a number of power sources, such as, for example, an AC-DC converter (not shown) to convert conventional AC power present in a building, a DC-DC converter (not shown) to convert a conventional DC power source to a voltage suitable for the transmitter 200, or directly from a conventional DC power source (not shown).

As a non-limiting example, the presence detector 280 may be a motion detector utilized to sense the initial presence of a device to be charged that is inserted into the coverage area of the transmitter. After detection, the transmitter may be turned on and the RF power received by the device may be used to toggle a switch on the Rx device in a pre-determined manner, which in turn results in changes to the driving point impedance of the transmitter.

As another non-limiting example, the presence detector 280 may be a detector capable of detecting a human, for example, by infrared detection, motion detection, or other suitable means. In some exemplary embodiments, there may be regulations limiting the amount of power that a transmit antenna may transmit at a specific frequency. In some cases, these regulations are meant to protect humans from electromagnetic radiation. However, there may be environments where transmit antennas are placed in areas not occupied by humans, or occupied infrequently by humans, such as, for example, garages, factory floors, shops, and the like. If these environments are free from humans, it may be permissible to increase the power output of the transmit antennas above the normal power restrictions regulations. In other words, the controller 214 may adjust the power output of the transmit antenna 204 to a regulatory level or lower in response to human presence and adjust the power output of the transmit antenna 204 to a level above the regulatory level when a human is outside a regulatory distance from the electromagnetic field of the transmit antenna 204.

As a non-limiting example, the enclosed detector 290 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 200 does not remain on indefinitely may be used. In this case, the transmitter 200 may be programmed to shut off after a user-determined amount of time. This feature prevents the transmitter 200, notably the power amplifier 210, from running long after the wireless devices in its perimeter are fully charged. This event may be due to the failure of the circuit to detect the signal sent from either the repeater or the receive coil that a device is fully charged. To prevent the transmitter 200 from automatically shutting down if another device is placed in its perimeter, the transmitter 200 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
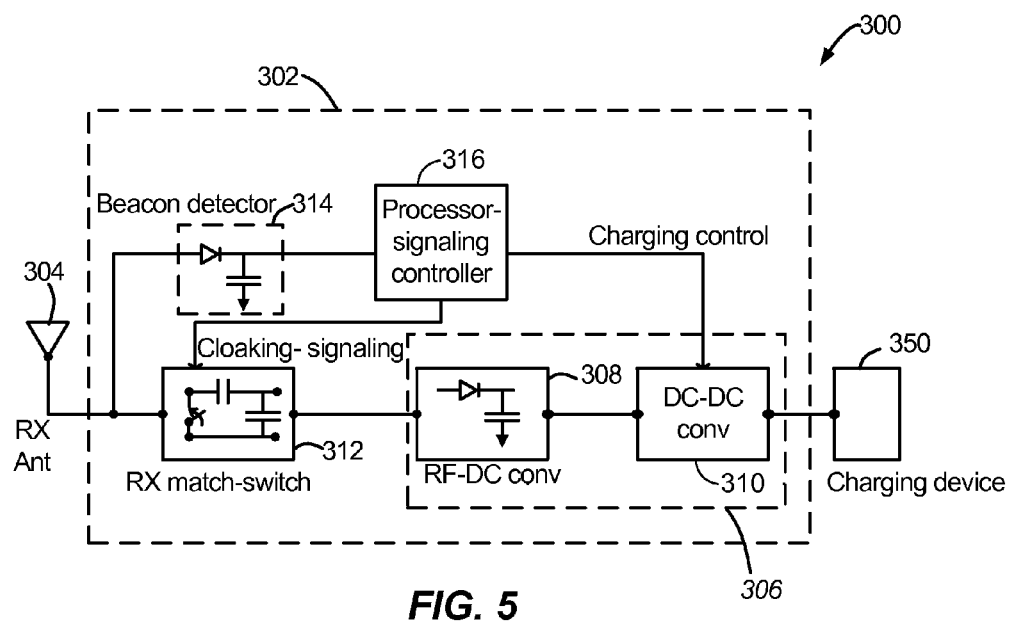
FIG. 5 is a simplified block diagram of a receiver, in accordance with an exemplary embodiment of the present invention.

FIG. 5 is a simplified block diagram of a receiver 300, in accordance with an exemplary embodiment of the present invention. The receiver 300 includes receive circuitry 302 and a receive antenna 304. Receiver 300 further couples to device 350 for providing received power thereto. It should be noted that receiver 300 is illustrated as being external to device 350 but may be integrated into device 350. Generally, energy is propagated wirelessly to receive antenna 304 and then coupled through receive circuitry 302 to device 350.

According to one exemplary embodiment as described more fully below, receiver 300 may include a protection circuit, which may generate a current therein to oppose an external generated field (e.g., a field generated by a remote wireless power transmitter). Accordingly, the circuit may null a field within a region proximate the circuit. More specifically, in an exemplary embodiment wherein receiver 300 is integrated within a near-field communication device, the protection circuit may be configured to at least partially protect a receiver, which is configured to receive a near-field communication signal, from a wireless power field. According to another exemplary embodiment, wherein receiver 300 is configured for receiving wireless power, a protection circuit may be utilized for at least partially protecting a portion of a device (e.g., a display screen of a mobile telephone) from wireless power.

Receive antenna 304 is tuned to resonate at the same frequency, or within a specified range of frequencies, as transmit antenna 204 (FIG. 4). Receive antenna 304 may be similarly dimensioned with transmit antenna 204 or may be differently sized based upon the dimensions of the associated device 350. By way of example, device 350 may be a portable electronic device having diametric or length dimension smaller that the diameter of length of transmit antenna 204. In such an example, receive antenna 304 may be implemented as a multi-turn antenna in order to reduce the capacitance value of a tuning capacitor (not shown) and increase the receive antenna's impedance. By way of example, receive antenna 304 may be placed around the substantial circumference of device 350 in order to maximize the antenna diameter and reduce the number of loop turns (i.e., windings) of the receive antenna and the inter-winding capacitance.

Receive circuitry 302 provides an impedance match to the receive antenna 304. Receive circuitry 302 includes power conversion circuitry 306 for converting a received RF energy source into charging power for use by device 350. Power conversion circuitry 306 includes an RF-to-DC converter 308 and may also in include a DC-to-DC converter 310. RF-to-DC converter 308 rectifies the RF energy signal received at receive antenna 304 into a non-alternating power while DC-to-DC converter 310 converts the rectified RF energy signal into an energy potential (e.g., voltage) that is compatible with device 350. Various RF-to-DC converters are contemplated, including partial and full rectifiers, regulators, bridges, doublers, as well as linear and switching converters.

Receive circuitry 302 may further include switching circuitry 312 for connecting receive antenna 304 to the power conversion circuitry 306 or alternatively for disconnecting the power conversion circuitry 306. Disconnecting receive antenna 304 from power conversion circuitry 306 not only suspends charging of device 350, but also changes the "load" as "seen" by the transmitter 200 (FIG. 2).

As disclosed above, transmitter 200 includes load sensing circuit 216 which detects fluctuations in the bias current provided to transmitter power amplifier 210. Accordingly, transmitter 200 has a mechanism for determining when receivers are present in the transmitter's near-field.

When multiple receivers 300 are present in a transmitter's near-field, it may be desirable to time-multiplex the loading and unloading of one or more receivers to enable other receivers to more efficiently couple to the transmitter. A receiver may also be cloaked in order to eliminate coupling to other nearby receivers or to reduce loading on nearby transmitters. This "unloading" of a receiver is also known herein as a "cloaking." Furthermore, this switching between unloading and loading controlled by receiver 300 and detected by transmitter 200 provides a communication mechanism from receiver 300 to transmitter 200 as is explained more fully below. Additionally, a protocol can be associated with the switching which enables the sending of a message from receiver 300 to transmitter 200. By way of example, a switching speed may be on the order of 100 µsec.

In an exemplary embodiment, communication between the transmitter and the receiver refers to a device sensing and charging control mechanism, rather than conventional two-way communication. In other words, the transmitter may use on/off keying of the transmitted signal to adjust whether energy is available in the near-field. The receivers interpret these changes in energy as a message from the transmitter. From the receiver side, the receiver may use tuning and detuning of the receive antenna to adjust how much power is being accepted from the near-field. The transmitter can detect this difference in power used from the near-field and interpret these changes as a message from the receiver. It is noted that other forms of modulation of the transmit power and the load behavior may be utilized.

Receive circuitry 302 may further include signaling detector and beacon circuitry 314 used to identify received energy fluctuations, which may correspond to informational signaling from the transmitter to the receiver. Furthermore, signaling and beacon circuitry 314 may also be used to detect the transmission of a reduced RF signal energy (i.e., a beacon signal) and to rectify the reduced RF signal energy into a nominal power for awakening either un-powered or power-depleted circuits within receive circuitry 302 in order to configure receive circuitry 302 for wireless charging.

Receive circuitry 302 further includes processor 316 for coordinating the processes of receiver 300 described herein including the control of switching circuitry 312 described herein. Cloaking of receiver 300 may also occur upon the occurrence of other events including detection of an external wired charging source (e.g., wall/USB power) providing charging power to device 350. Processor 316, in addition to controlling the cloaking of the receiver, may also monitor beacon circuitry 314 to determine a beacon state and extract messages sent from the transmitter. Processor 316 may also adjust DC-to-DC converter 310 for improved performance.

Figure 6:
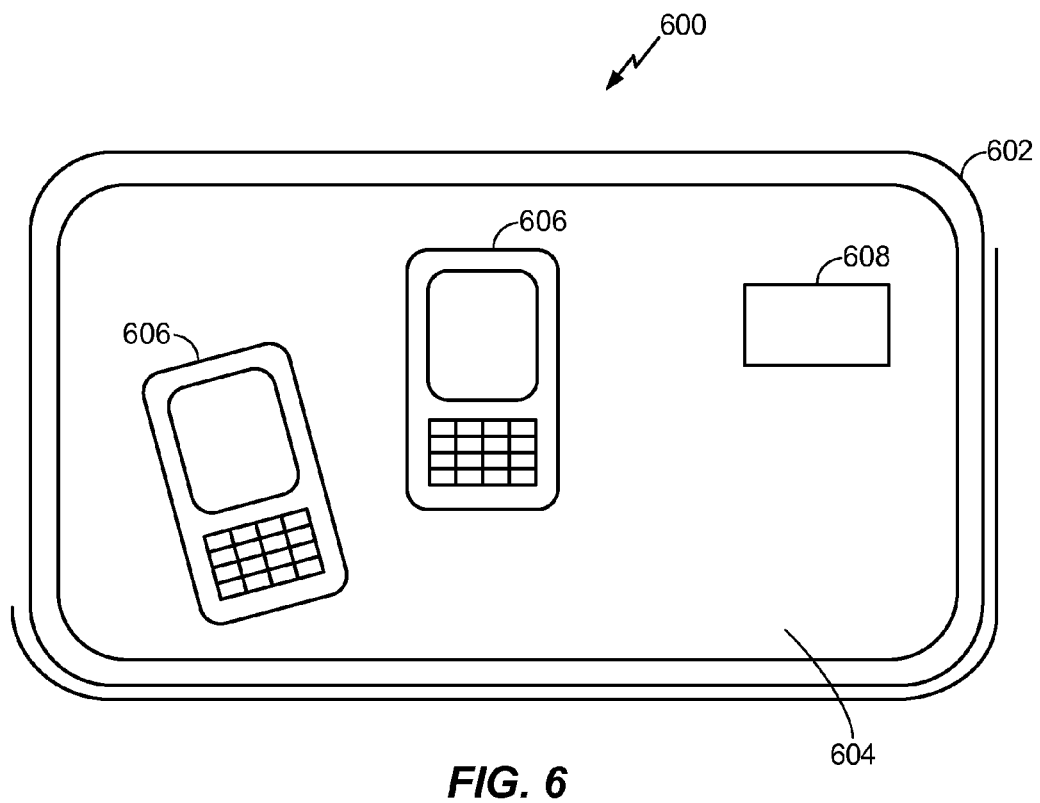
FIG. 6 is a wireless power system including a wireless power transmitter and a plurality of devices positioned on a charging pad of the wireless power transmitter.

FIG. 6 illustrates a wireless power system 600 including a wireless power device 602 having a charging pad 604. As illustrated in FIG. 6, a plurality of wirelessly chargeable devices 606 are positioned on charging pad 604. Moreover, device 608, which may comprise an NFC card or an RFID card, is positioned on charging pad 604. As will be appreciated by a person having ordinary skill in the art, in the event device 608 receives excessive power from wireless power device 602, undesirable heating of device 608 may result, which may cause damage thereto.

Exemplary embodiments, as described herein, relate to reducing, and possibly preventing damage caused to a device by wireless power transmitted at either a frequency that is not an intended frequency of the device or to a region of the device which is not intended to receive wireless power. More specifically, exemplary embodiments may comprise a device, such as a NFC card or an RFID card, having a circuit, which is either coupled to the device or integrated within the device, that may decouple a coil of the device from an external transmitter (e.g., an external wireless power transmitter). Yet more specifically, a device, which in this example comprises a NFC card, may have a circuit (e.g., a coil) for receiving a signal (e.g., wireless power or NFC) from a remote transmitter. Furthermore, the NFC card may also include a second coil coupled thereto or integrated therein that is configured to exhibit a low impedance (e.g., short-circuit) at certain frequencies (e.g., non-operational frequencies) and, therefore, generate a magnetic field that opposes a magnetic field generated by a remote transmitter. Additionally, the second coil may be configured to exhibit a high impedance (e.g., an open circuit) at an operational frequency at which the NFC card is designed to operate, thus enabling the NFC to function normally.

Figure 7:
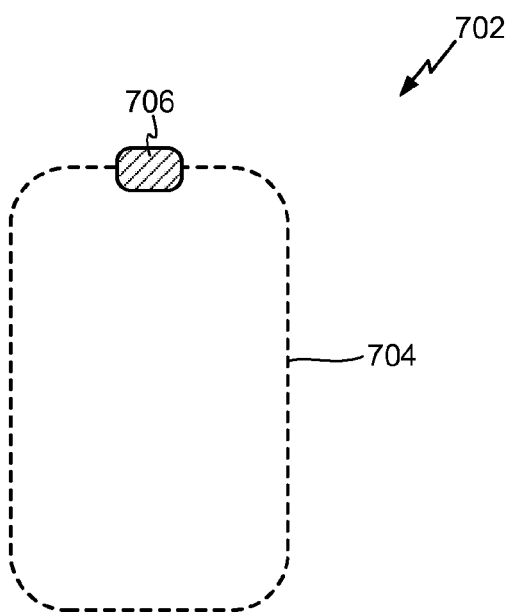
FIG. 7 illustrates circuitry including a coil and a circuit, according to an exemplary embodiment of the present invention.
Figure 8:
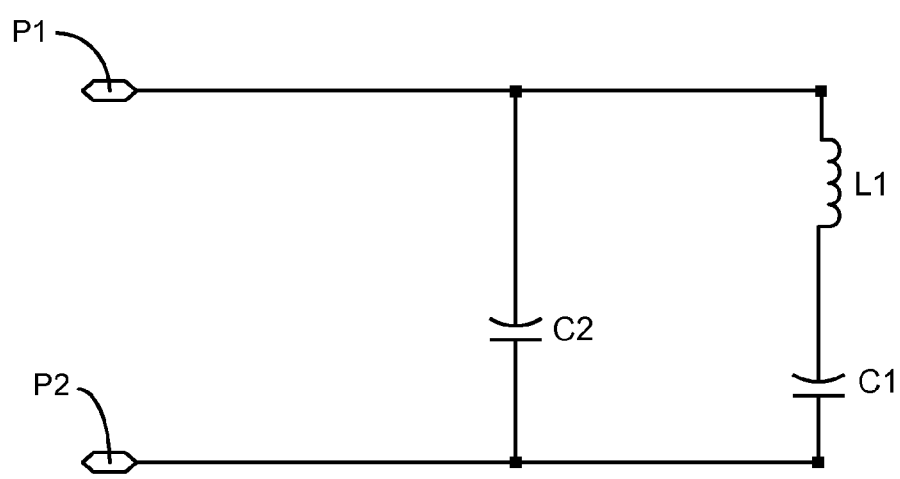
FIG. 8 illustrates a circuit, in accordance with an exemplary embodiment of the present invention.

FIG. 7 illustrates a circuit 702 including a coil 704 and a circuit 706. Circuit 706, which may comprise, for example only, a shunt-series circuit, is illustrated in further detail in FIG. 8. As illustrated in FIG. 8, circuit 706 may include capacitors C1 and C2 and inductor L1. Further, circuit 706 may include a first port P1, which may be coupled to one end of coil 704, and a second port P2, which may be coupled to another end of coil 704. By way of example only, inductor L1 may have an inductance of substantially 150 nH. Furthermore, as non-limiting examples, capacitor C1 may have a capacitance of substantially 3300 pF and capacitor C2 may have a capacitance of substantially 1272 pF.

Figure 9:
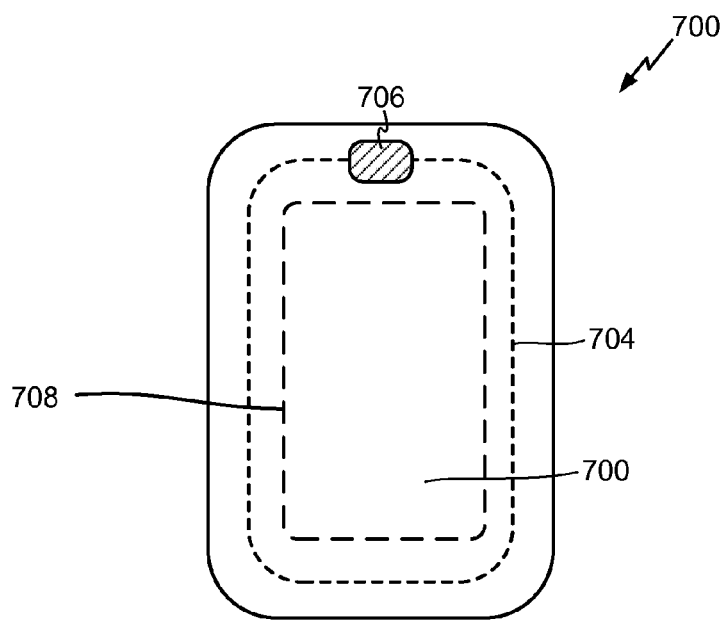
FIG. 9 depicts a device including a circuit, according to an exemplary embodiment of the present invention.

FIG. 9 illustrates a device 700 comprising a circuit 702 including a coil 704 and a circuit 706. Device 700 may comprise, for example only, an NFC card or an RFID card. Device 700 may further include circuitry 708 (e.g., a coil) configured for near-field communication with one or more remote devices. It is noted that, according to one exemplary embodiment, circuit 702 may be attached to a surface of device 700 by any suitable means. By way of example only, circuit 702 may be integrated within a sticker that may attach to device 700. According to another exemplary embodiment, circuit 702 may be integrated within device 702. It is noted that coil 704 may comprise any number of turns and may be sized substantially similar to coil 708. Stated another way, coil 704 may substantially circumscribe coil 708 to enable strong coupling between coil 704 and coil 708. By way of example, coil 704 may comprise one turn.

As will be appreciated by a person having ordinary skill in the art, by Lenz's law, any untuned shorted parasitic coil located within the vicinity of a receive coil which is excited by an external magnetic field, will generate a magnetic field current, which opposes the externally excited magnetic field. As a result, the shorted parasitic coil may create a null in the magnetic field proximate thereto. Accordingly the receive coil may be decoupled from the magnetic field. Stated another way, while "shorted," the parasitic coil acts as a notch filter and while "open," the parasitic coil may not have an substantial effect on the receive coil. It is noted that this is a wideband effect, and, thus, a shorted parasitic coil may cancel the magnetic field at all frequencies of interest. Stated another way, while exhibiting a substantially equivalent short circuit impedance, the parasitic coil acts as a notch filter and while exhibiting a substantially equivalent open circuit impedance, the parasitic coil may not have an substantial effect on the receive coil. It is noted that this is a wideband effect and, thus, a low-impedance (e.g., shorted) parasitic coil may cancel the magnetic field at all frequencies of interest.

With reference to FIGS. 6 and 9, a contemplated operation of device will now be described. In this example, device 608 comprises device 700, and circuit 702 is configured to exhibit a high impedance (e.g., open-circuit) at 13.56 MHz and exhibit a low impedance (e.g., short-circuit) at all other frequencies (e.g., 6.78 MHz). Furthermore, in this example, wireless power device 602 is configured to wirelessly transmit power at 6.78 MHz. Accordingly, while wireless power device 602 is transmitting wireless power, circuit 702 presents a low impedance (e.g., short circuit impedance), which causes circuit 702 to generate a magnetic field that opposes a magnetic field generated by wireless power device 602. Accordingly, a null in the magnetic field proximate circuit 702 may exist and, therefore, coil 708 may not receive a signal generated by wireless power device 602. Furthermore, at a frequency of 13.56 MHz, circuit 702 is configured to present a high impedance (e.g., open-circuit impedance) and, therefore, circuit 702 may not have an effect on a field generated from an external source. As a result, coil 708 may receive a signal at 13.56 MHz. It is noted that although the frequencies of 6.78 MHz and 13.56 MHz are used in this example, circuit 702 may be configured to be exhibit a first impedance at any one or more desired frequencies and different, lower impedance at any one or more desired frequencies.

Figure 10:
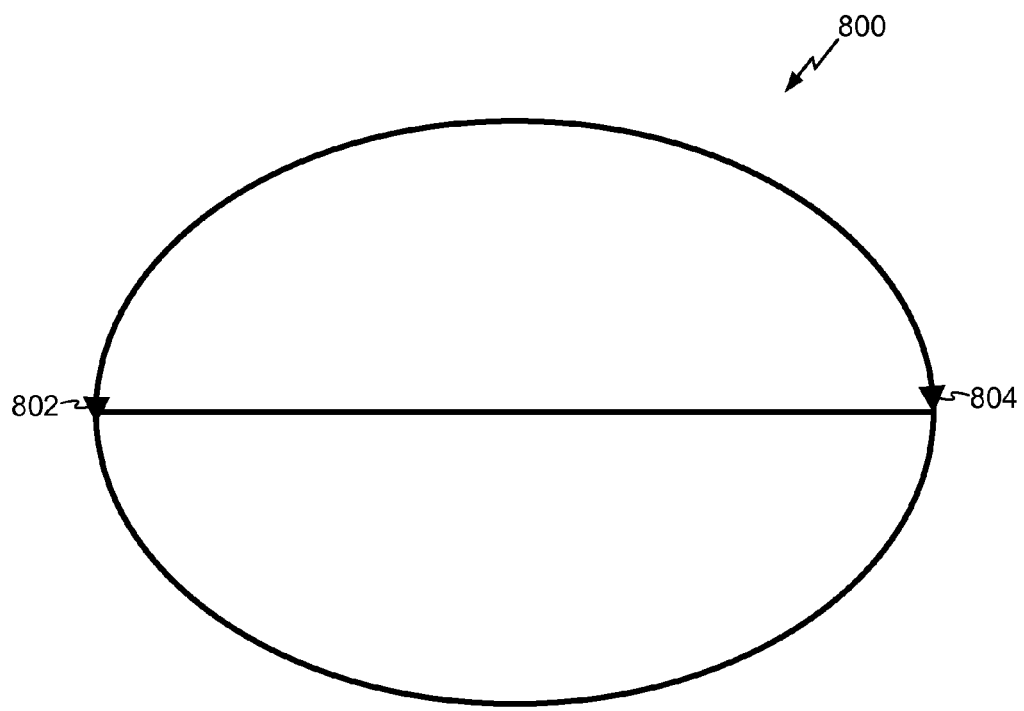
FIG. 10 is a Smith Chart illustrating various responses of a circuit, in accordance with an exemplary embodiment of the present invention.

FIG. 10 illustrates a Smith Chart 800 illustrating data points for circuit 702 in an open-circuit configuration and a short-circuited configuration. A data point 802 represents a response wherein circuit 702 is short-circuited at 6.78 MHz, decoupling device 702 from a remote transmit antenna. A data point 804 represents a response wherein circuit 702 is open-circuited at 13.56 MHz, enabling device 702 to couple to a remote transmit antenna. More specifically, for example only, data point 804 represents a response wherein circuit 702 is open-circuited at 13.56 MHz, enabling normal operation of device 700, which in this example comprises either an NFC card or an RFID card.

Figure 11:
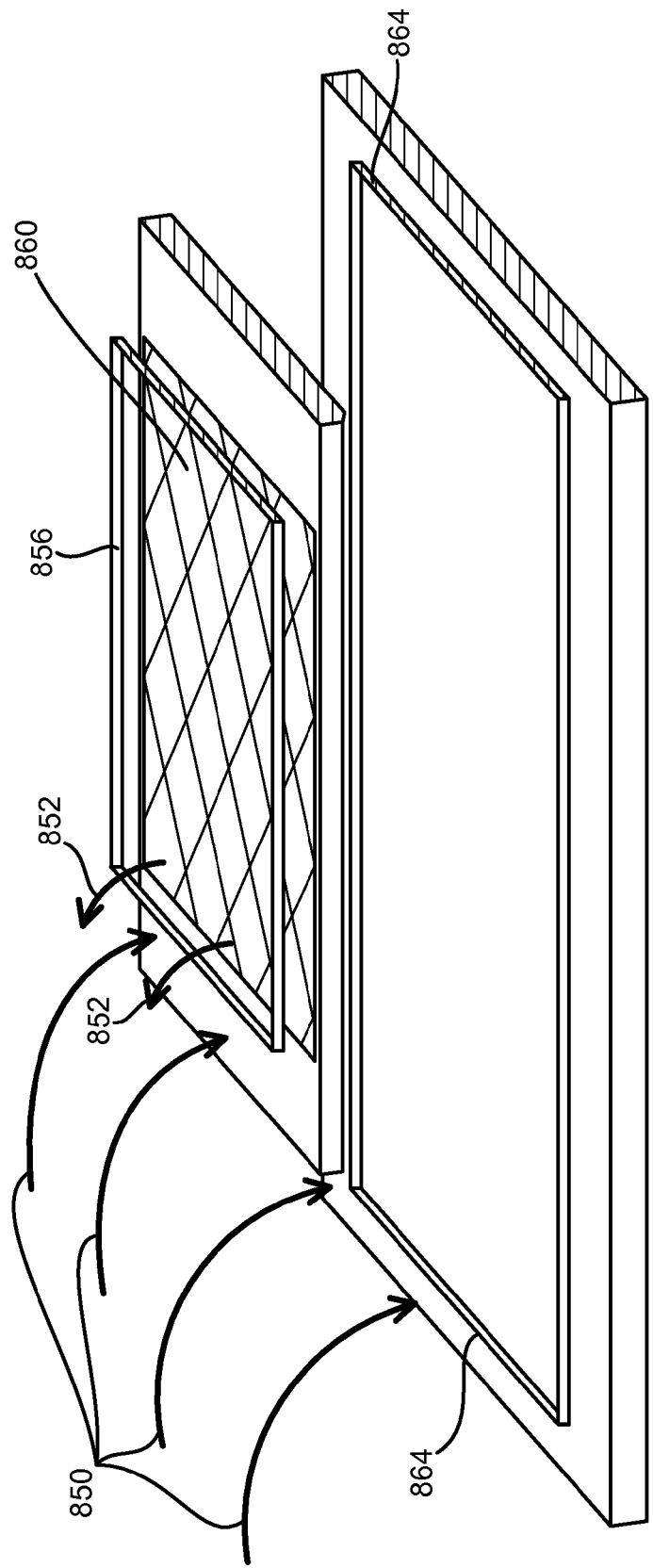
FIG. 11 illustrates a device including a receive coil and a parasitic coil, according to an exemplary embodiment of the present invention.

FIG. 11 is an illustration of a device 840 having a receive coil 864 and a parasitic coil 856. It is noted that receive coil 864 may comprise a receive antenna, such as antenna 304 of receiver 300 of FIG. 5. Accordingly, receive coil 864 may be configured for receiving wireless power at one or more frequencies (e.g., 13.56 MHz). Furthermore, parasitic coil 865 may be proximate a region 860 (e.g., a LCD screen or a touch screen) where shielding from a magnetic field is desired. Accordingly, while device 840 is positioned within an externally generated a magnetic field (depicted by reference numeral 850), receive coil 864 may receive a signal (e.g., wireless power) from the magnetic field and parasitic coil 865 may generate a magnetic field (depicted by reference numeral 852) that opposes magnetic field 850. It is noted that parasitic coil 865 may be configured to exhibit a low impedance (e.g., short-circuit impedance) at the same frequency in which receive coil 864 wirelessly receives power. Therefore, region 860 may be void of a magnetic field and, thus may be protected by excessive power while receive coil is enabled to wirelessly receive power. It is further noted that a parasitic coil (e.g., parasitic coil 865) positioned proximate a region where shielding is desired may be superior to solid metal shielding in situations where a solid shielding is not viable (e.g., a region including a transparent screen).

Figure 12:
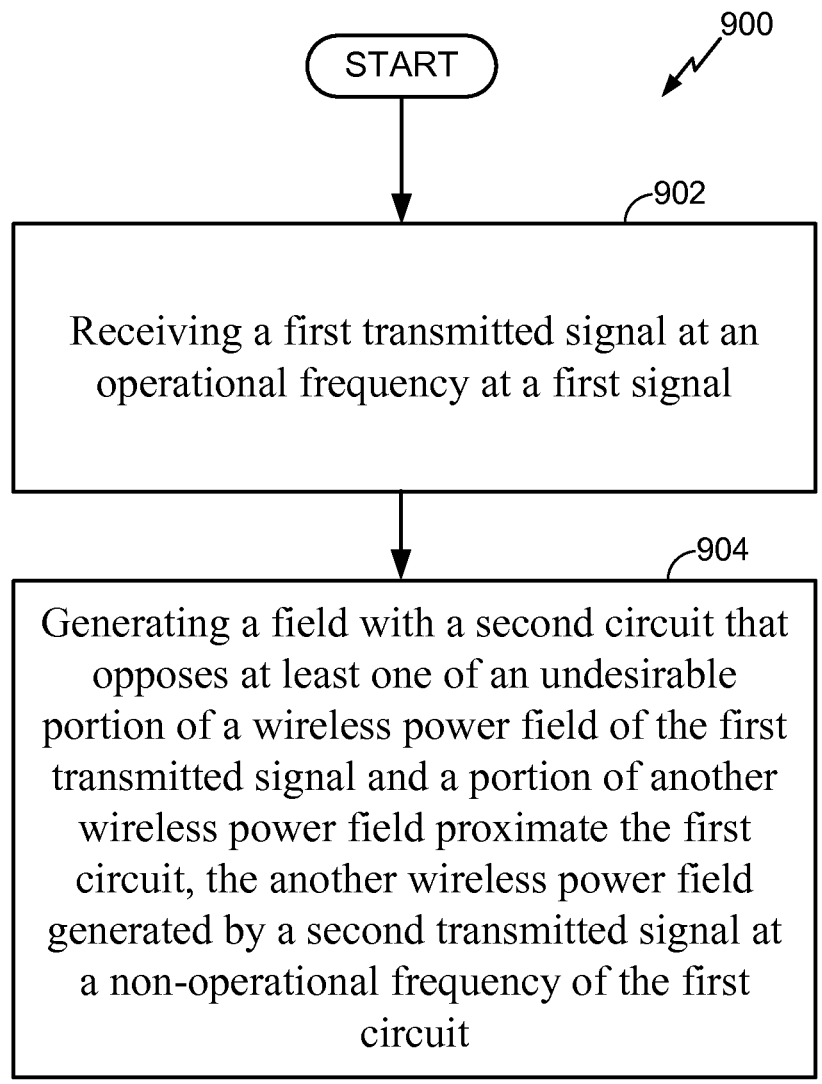
FIG. 12 is a flowchart illustrating a method, in accordance with an exemplary embodiment of the present invention.

FIG. 12 is a flowchart illustrating a method 900, in accordance with one or more exemplary embodiments. Method 900 may include receiving a first transmitted signal at an operational frequency at a first signal (depicted by numeral 902). Further, method 900 may include generating a field with a second circuit that opposes at least one of an undesirable portion of a wireless power field of the first transmitted signal and a portion of another wireless power field proximate the first circuit, the another wireless power field generated by a second transmitted signal at a non-operational frequency of the first circuit (depicted by numeral 904).

Exemplary embodiments of the invention, as described herein, may protect NFC cards from being damaged by a wireless power system, if the operating frequency of the wireless power system and NFC card operating frequency are different. It is noted that circuit 702 may be included with a wireless charger and attached to a device (e.g., NFC card) by a user, or attached to the device by the manufacturer, since it greatly decreases the possibility of damage from any EM radiation that is not at the intended frequency of the device. Moreover, exemplary embodiment, as described herein, may protect a region (e.g., a screen) of a device from being damaged by a wireless power system.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device for protecting circuitry, comprising:
   a first circuit configured to receive a first transmitted signal from a first transmitter at an operational frequency; and
   a second circuit configured to generate a magnetic field that opposes at least a portion of another magnetic field generated by a second transmitter at a frequency that is different from the operational frequency of the first circuit,
   wherein the second circuit is further configured to exhibit a first impedance in response to the operational frequency and exhibit a second impedance in response to the frequency that is different from the operational frequency.

2. The device of claim 1, wherein the second impedance is lower than the first impedance.

3. The device of claim 2, wherein the second circuit is configured to exhibit the second impedance by exhibiting a short circuit impedance.

4. The device of claim 1, wherein the first circuit comprises a receive coil, and wherein the second circuit comprises a parasitic coil.

5. The device of claim 1, wherein the second circuit comprises a shunt-series circuit coupled to a coil.

6. The device of claim 1, wherein the first circuit and/or the second circuit are integrated within one of an NFC card or an RFID card.

7. The device of claim 1, wherein the second circuit is coupled to a surface of one of an NFC card or an RFID card.

8. The device of claim 1, wherein the operational frequency comprises a frequency that is substantially equal to 13.56 MHz, and wherein the frequency that is different from the operational frequency comprises one of a frequency that is substantially equal to 468.75 KHz or a frequency that is substantially equal to 6.78 MHz.

9. The device of claim 1, wherein the second circuit circumscribes the first circuit.

10. The device of claim 1, wherein the first circuit is further configured to receive one of a wireless power signal and a near-field communication signal.

11. The device of claim 1, wherein the second circuit is configured to act as a notch filter.

12. The device of claim 1, wherein the generated magnetic field opposes at least one of a portion of a field generated by the first transmitter or a portion of another field proximate the first circuit.

13. A method for protecting circuitry, comprising:
    receiving a first transmitted signal from a first transmitter at an operational frequency by a first circuit; and
    generating a magnetic field by a second circuit that opposes at least a portion of another magnetic field generated by a second transmitter at a frequency that is different from the operational frequency of the first circuit,
    wherein the second circuit is further configured to exhibit a first impedance in response to the operational frequency and exhibit a second impedance in response to the frequency that is different from the operational frequency.

14. The method of claim 13, wherein the first transmitted signal is at a frequency that is substantially equal to 13.56 MHz and wherein the generated magnetic field generated in response to receipt of a second transmitted signal from the second transmitter comprises one of a frequency that is substantially equal to 468.75 KHz or a frequency that is substantially equal to 6.78 MHz.

15. The method of claim 13, wherein the second circuit is configured to exhibit a short circuit impedance.

16. The method of claim 13, wherein the second circuit circumscribes the first circuit.

17. The method of claim 13, wherein the second circuit comprises a shunt-series circuit coupled to a coil.

18. The method of claim 13, wherein the second circuit is integrated within one of an NFC card or an RFID card.

19. The method of claim 13, wherein generating the magnetic field by the second circuit comprises generating a current that opposes the at least a portion of another magnetic field generated by the second transmitter.

20. The method of claim 13, wherein the generated magnetic field opposes at least one of a portion of a field generated by the first transmitter or a portion of another field proximate the first circuit.

21. The method of claim 13, wherein the second impedance is lower than the first impedance.

22. The method of claim 21, further comprising exhibiting a short circuit impedance in response to the frequency that is different from the operational frequency.

23. A device for protecting circuitry, comprising:
 means for receiving a first transmitted signal from a first transmitter at an operational frequency; and
 means for generating a magnetic field that opposes at least a portion of another magnetic field generated by a second transmitter at a frequency that is different from the operational frequency of the receiving means,
 wherein the generating means is further configured to exhibit a first impedance in response to the operational frequency and exhibit a second impedance in response to the frequency that is different from the operational frequency.

24. The device of claim 23, wherein the generating means comprises means for generating a current that opposes the at least the portion of another magnetic field generated by the second transmitter.

25. The device of claim 23, wherein the receiving means comprises a receive coil and the generating means comprises a parasitic coil.

* * * * *